United States Patent
Dussauby et al.

(10) Patent No.: US 6,570,460 B1
(45) Date of Patent: May 27, 2003

(54) VOLTAGE-TUNABLE OSCILLATOR WITH DIELECTRIC RESONATOR INCLUDING A FERROELECTRIC CERAMIC MATERIAL

(75) Inventors: Marie-Pierre Dussauby, St Leu la Foret (FR); Daniel Peris, Paris (FR); Jean-Pierre Ganne, Orsay (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/890,933
(22) PCT Filed: Feb. 4, 2000
(86) PCT No.: PCT/FR00/00272
§ 371 (c)(1), (2), (4) Date: Aug. 6, 2001
(87) PCT Pub. No.: WO00/46913
PCT Pub. Date: Aug. 10, 2000

(30) Foreign Application Priority Data

Feb. 5, 1999 (FR) ............................................. 99 01380

(51) Int. Cl.⁷ ................................................. H03B 5/18
(52) U.S. Cl. .............................. 331/96; 337/99; 337/56; 337/34
(58) Field of Search ................................ 331/96, 9, 34, 331/56; 333/219.1, 234, 202, 235

(56) References Cited

U.S. PATENT DOCUMENTS

| 5,143,636 | A |   | 9/1992  | Gaucher et al. |
|-----------|---|---|---------|----------------|
| 5,557,090 | A |   | 9/1996  | Ganne et al. |
| 5,652,556 | A | * | 7/1997  | Flory et al. ............... 333/219.1 |
| 5,752,175 | A |   | 5/1998  | Roullet et al. |
| 6,078,223 | A | * | 6/2000  | Romanofsky et al. ......... 331/9 |
| 6,144,263 | A | * | 11/2000 | Katsumata et al. ............ 331/96 |
| 6,172,572 | B1| * | 1/2001  | Kajikawa et al. ............. 331/96 |
| 6,297,707 | B1| * | 10/2001 | Martheli et al. ............... 331/96 |
| 6,326,854 | B1| * | 12/2001 | Nicholls et al. ............... 331/56 |
| 6,407,645 | B1| * | 6/2002  | Fulmer et al. ................ 331/96 |
| 6,433,646 | B2| * | 8/2002  | Kose et al. .................... 331/96 |

* cited by examiner

Primary Examiner—Michael Tokar
Assistant Examiner—Lam T. Mai
(74) Attorney, Agent, or Firm—Oblon, Spivak, McClelland, Maier & Neustadt, P.C.

(57) ABSTRACT

A voltage-controlled oscillator including a dielectric resonator having a ferroelectric ceramic material placed between two metallized surfaces and biased by an electric field created by a difference in potential applied between the two surfaces as a function of a tuning frequency of the oscillator. Also included is a load impedance, and an active amplifier element coupled between the dielectric resonator and the load impedance. Further, the ceramic material is formed by metal oxides of the family: $Ba_x Sr_{(1-x)} Ti_{(1-y)}(A)_y O_3$ (1) in which: A is a constituent configured to reduce dielectric losses of the material, and $-0.4 \leq x \leq 0.9 - 0.001 \leq y \leq 0.2$.

10 Claims, 1 Drawing Sheet

VOLTAGE-TUNABLE OSCILLATOR WITH DIELECTRIC RESONATOR INCLUDING A FERROELECTRIC CERAMIC MATERIAL

BACKGROUND OF THE INVENTION

Field of the Invention

The present invention relates to a voltage-tunable oscillator with a dielectric resonator.

It can be applied especially to the making of frequency synthesizers that can be used in radio transmitter/receiver stations working in frequency-hop mode.

DISCUSSION OF THE BACKGROUND

Voltage-controlled oscillators conventionally comprise a dielectric resonator whose resonance frequency is fixed. This resonator is coupled with a diode, also called a varicap, whose capacitance varies according to a voltage level that is applied to it. This has the effect of modifying the tuning frequency of the oscillator continuously in a given frequency band.

One embodiment of an oscillator working according to this principle is described especially in an article by Mr. E. Hénicle, "VCO Design Using Coaxial Resonators" in the journal Trans-Tech Inc, November 1995.

In these oscillators the use of a varicap diode has the drawback of causing a drop in the Q factor of the resonator. This results in a deterioration of the phase noise.

SUMMARY OF THE INVENTION

The goal of the invention is to produce an oscillator that is voltage tunable in a wide range of frequencies without deterioration in the Q factor of the resonator.

To this end, an object of the invention is a voltage-controlled oscillator comprising a dielectric resonator, coupled to a load impedance through an active amplifier element characterized in that the dielectric resonator is made of a ferroelectric ceramic placed between two metallized surfaces and biased by an electric field created by a difference in potential applied between the two surfaces as a function of the tuning frequency of the oscillator.

An advantage of the invention is that it enables the application of a voltage control directly to the material forming the resonator without causing any deterioration in its Q factor. Through this principle, it becomes possible to produce a voltage-controlled oscillator having a characteristic phase noise of at least 20 dB in a very wide range of frequencies from the UHF wave bands to the microwave bands. This result cannot be achieved with the prior art oscillators controlled by varicap diodes.

BRIEF DESCRIPTION OF THE DRAWINGS

Other characteristics and advantages of the invention will be seen from the following description made with reference to FIG. 1, which represents an embodiment of a voltage-controlled oscillator according to the invention.

DESCRIPTION OF THE PREFERRED EMBODIMENTS

Figure 1:
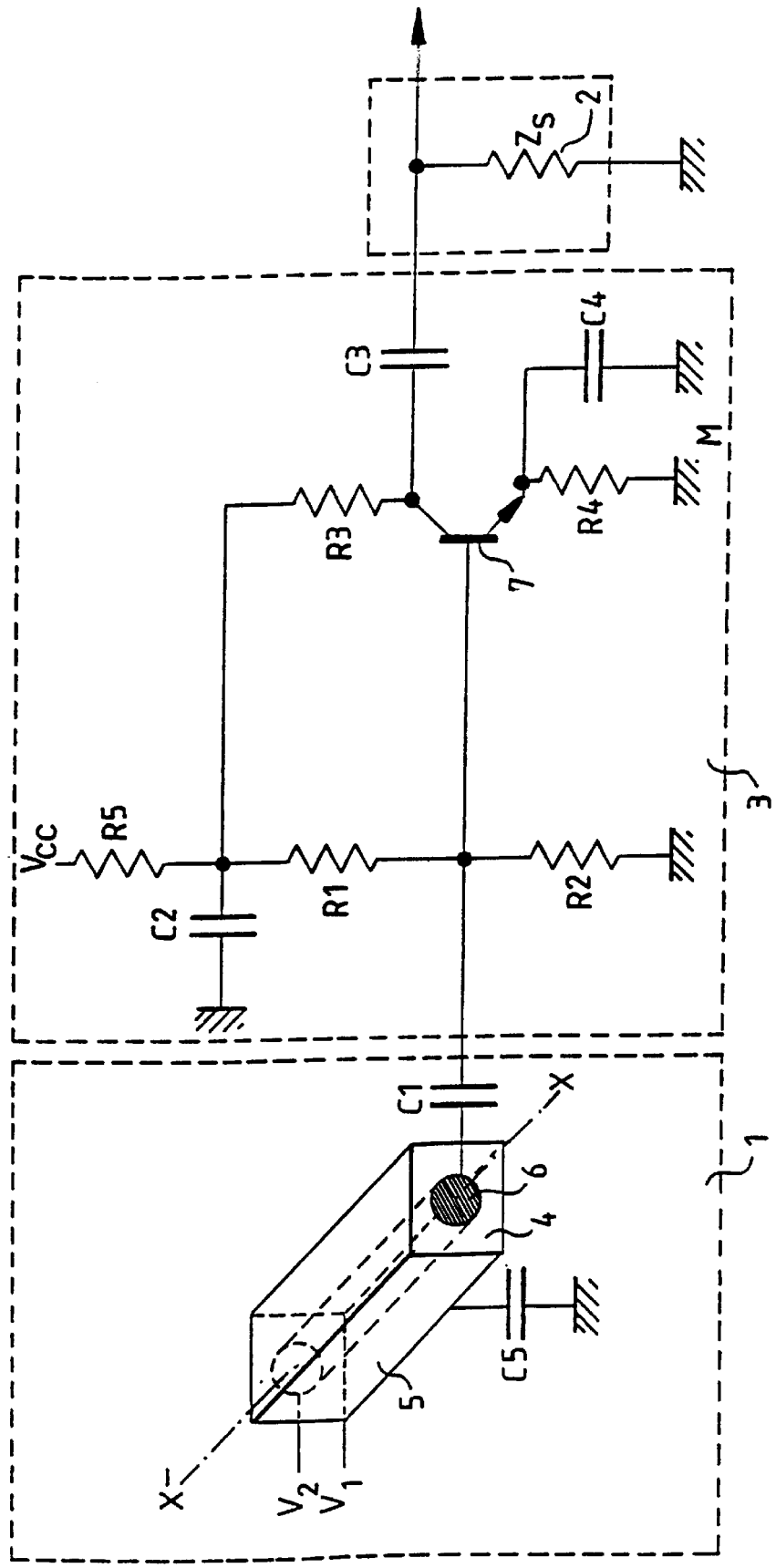

The oscillator according to the invention which is shown in FIG. 1 comprises a resonator 1 coupled to a load 2 by an active element 3. The resonator 1 is made out of a barium-strontium-titanium ceramic material of the type described by M. LABEYRIE, F. GUERIN, T. M. ROBINSON and J. P. GANNE of the THOMSON-CSF Research Center in "Microwave Characterisation of Ferroelectric Ba1-x Srx Ti O3 Ceramics", Proceedings of the 1994 IEEE Conference on Antenna Propagation.

These materials possess the property of having permittivity values that can vary under the effect of an electric field lower than or equal to a few hundreds of volts per millimeter. This variability of permittivity is all the greater as the composition of the material is rich in barium. In the same way the dielectric losses are all the smaller as the material is rich in strontium. The material implemented in the invention belongs to the family of ceramics having the formula:

$$Ba_xSr_{(1-x)}Ti_{(1-y)}(A)_yO_3 \qquad (1)$$

where: A is a constituent enabling a reduction in the dielectric losses of the material which may be, in particular, iron, manganese or a combination of both these materials.

$$-0.4 \leq x \leq 0.9$$

$$-0.001 \leq y \leq 0.2$$

Its forms and dimensions are suited to the desired tuning frequencies Fo of the oscillator.

In the figure, the dielectric material 4 has the shape of a right-angled parallelepiped bar covered on its external surface with a metal deposit 5. It is crossed by a metallized via hole 6 centered on its longitudinal axis XX'. Made in this way, the resonator behaves like a coaxial line whose capacitance per unit length varies in proportion to the variation in the permittivity of the ceramic material 4. This enables it to be made to resonate at a tuning frequency Fo that depends on its length and on the magnitude of the electric field applied between the metal surfaces in the thickness of the material. The resonator can also be made in the form of a cylindrical bar, a cavity or a disc or again by using techniques for the manufacture of microstrip or stripline circuits.

In the embodiment shown, the external metal surface 5 is subjected to a continuous level of voltage V1 and the metallized hole 6 is subjected to a continuous level of voltage V2 relative to the potential of a ground circuit M. The difference in potential V2−V1 defines the tuning frequency. This configuration is particularly well suited to the use of the oscillator in a phase-locked loop of a frequency synthesizer. In this case, the voltage V1 corresponds to a pre-tuning voltage that is "not large" and the voltage V2 corresponds to the voltage delivered by the phase comparator of the frequency synthesizer which corresponds to the "rough" control voltage.

However it is also possible, according to another embodiment of the invention, to use only one control voltage. It is enough, in this case, to directly connect the metal surface 5 to the ground circuit M.

The oscillations are sustained by the active element 3 whose input, which is coupled to one end of the metallized hole 6 by a connection C1, has a negative resistance.

The active element 3 comprises a transistor 7 that is biased in a known way between a supply voltage Vcc and the ground circuit M by two resistors R1, R2 mounted as a potentiometric divider, connected by their common ends to the base of the transistor 7, a collector resistor R3 and an emitter resistor R4 uncoupled by a capacitor C4 from the ground circuit M.

The voltage Vcc is applied to the free ends of the resistors R1 and R3 by a resistor R5 and the common point of the resistors R1, R3 and R5 is uncoupled from the ground circuit M by a capacitor C2.

The inductive load 2 is coupled with the collector of the transistor 7 by a capacitor C3.

The noise parameters of the oscillator depend on the quality of the active element 3 and the Q factor of the resonator. This quality is obtained by using a transistor with low phase noise in 1/f as well as a very good noise factor. The Q factor of the resonator and its ability to be controlled depend on the composition of the ceramic material 4 and metallization quality.

What is claimed is:

1. A voltage-controlled oscillator comprising:

a dielectric resonator including a ferroelectric ceramic material placed between two metallized surfaces and biased by an electric field created by a difference in potential applied between the two surfaces as a function of a tuning frequency of the oscillator;

a load impedance; and an active amplifier element coupled between the dielectric resonator and the load impedance, wherein the ceramic material is formed by metal oxides of the family:

$$Ba_x Sr_{(1-x)} Ti_{(1-y)} (A)_y O_3 \tag{1}$$

in which:

A is a constituent configured to reduce dielectric losses of the material, and $-0.4 \leq x \leq 0.9$ $-0.001 \leq y \leq 0.2$.

2. The oscillator according to claim 1, wherein A is selected from the group consisting of iron, magnesium, and a combination of iron and magnesium.

3. The oscillator according to claim 1, further comprising means for applying, between the two surfaces, an electric field lower than or equal to a few hundreds of volts per millimeter.

4. The oscillator according to claim 1, wherein the ceramic material has a form of a right-angled parallelepiped bar covered on its external surface by a metal deposit and is crossed by a metallized hole centered on its longitudinal axis.

5. The oscillator according to claim 1, wherein the ceramic material has a form of a cylindrical bar covered on its external surface by a metal deposit and crossed by a metallized hole centered on its longitudinal axis.

6. The oscillator according to claim 1, wherein the resonator is made in a form of a microstrip circuit.

7. The oscillator according to claim 1, wherein the ceramic material has a form of a disk.

8. A frequency synthesizer comprising:

a voltage-controlled oscillator including, a dielectric resonator including a ferroelectric ceramic placed between two metallized surfaces and biased by an electric field created by a difference in potential applied between the two surfaces as a function of a tuning frequency of the oscillator;

a load impedance, and an active amplifier element coupled between the dielectric resonator and the load impedance, wherein the ceramic material is formed by metal oxides of the family:

$$Ba_x Sr_{(1-x)} Ti_{(1-y)} (A)_y O_3 \tag{1}$$

in which:

A is a constituent configured to reduce dielectric losses of the material, and $-0.4 \leq x \leq 0.9$ $-0.001 \leq y \leq 0.2$.

9. A voltage-controlled oscillator comprising:

a dielectric resonator including a ferroelectric ceramic material placed between two metallized surfaces and biased by an electric field created by a difference in potential applied between the two surfaces as a function of a tuning frequency of the oscillator;

a load impedance; and an active amplifier element coupled between the dielectric resonator and the load impedance, wherein the ceramic material is formed by metal oxides of the family $Ba_{(1-x)} Sr_x TiO_3$.

10. A frequency synthesizer comprising:

a voltage-controlled oscillator including, a dielectric resonator including a ferroelectric ceramic placed between two metallized surfaces and biased by an electric field created by a difference in potential applied between the two surfaces as a function of a tuning frequency of the oscillator;

a load impedance, and an active amplifier element coupled between the dielectric resonator and the load impedance, wherein the ceramic material is formed by metal oxides of the family $Ba_{(1-x)} Sr_x TiO_3$.

* * * * *